US006420663B1

(12) United States Patent
Zelikson et al.

(10) Patent No.: US 6,420,663 B1
(45) Date of Patent: Jul. 16, 2002

(54) ONE LAYER SPIDER INTERCONNECT

(75) Inventors: Michael Zelikson; Moshe Leibowitz; Israel Wagner, all of Haifa (IL)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/731,386

(22) Filed: Nov. 30, 2000

(51) Int. Cl.[7] ............................................... H01R 23/68
(52) U.S. Cl. ....................... 174/261; 174/260; 257/692; 326/30; 361/772
(58) Field of Search ................................ 174/255, 260, 174/261, 262; 257/664, 690, 692; 326/30; 361/772

(56) References Cited

U.S. PATENT DOCUMENTS 4,592,606 A * 6/1986 Mudra ......................... 439/516
5,363,383 A * 11/1994 Nimishakavi ................ 714/724
6,118,350 A * 9/2000 Gupta et al. .................. 257/664

OTHER PUBLICATIONS

H.B. Bakoglu, "Circuits, Interconnections, and Packaging for VLSI", Addison–Wesley Publishing Company, 1990, pp. 13–15.

* cited by examiner

Primary Examiner—Albert W. Paladini
(74) Attorney, Agent, or Firm—Darby & Darby

(57) ABSTRACT

An integrated circuit device, including a substrate and a signal source disposed on the substrate. The signal. source is adapted to supply a pair of signals to a first plulrality of customers positioned remote from the signal source on the substrate, each of which customers is adapted to receive the pair of signals. There are a second plurality of conductors, formed substantially within a single layer of conductive material deposited on the substrate, and arranged to distribute the pair of signals from the signal source to each of the customers.

23 Claims, 3 Drawing Sheets

ONE LAYER SPIDER INTERCONNECT

FIELD OF THE INVENTION

The present invention relates generally to wiring layout of integrated circuits, and specifically to wiring layouts delivering high-speed signals with high on-chip fanout.

BACKGROUND OF THE INVENTION

Clock signals in synchronous circuits control the timing and throughput of the entire system, and it is thus critical to reduce skew between corresponding signals of the system. The skew is caused, amongst other factors, by the fact that not all circuits are equidistant. from the clock driver. Since the clock signals must be distributed globally, clock skew is a major concern in digital system design. One of the ways by which skew is minimized is by using a symmetric network for clock signal transfer.

Existing systems for dual signal distribution make extensive use of layer interchanges to keep the network symmetric. At frequencies of 2 GHz and higher, however, inductance and resistance effects in the network become more significant (capacitance effects become significant from a lower frequency limit). In particular, reflections from line-discontinuities such as inter-layer vias become increasingly significant and variable, FIG. 1 is a schematic diagram of a symmetric H-tree design used for distributing a single clock signal within an integrated circuit, as is known in the art. A clock signal is input at the center of the H-tree, and is distributed to customers at the extremities of the tree. In the context of the present patent application and in the claims, the term "customers" is used to refer to any and all circuits that receive and make use of the clock signal. Skew between the clock signals delivered to the customers is minimized since the paths to each customer are equal in length. The H-tree pattern can be used on a single layer as long as only one clock signal is distributed. In circuits, for example, comprising differential systems, where the clock signal comprises a symmetric differential (dual) signal, there is no way to make an H-tree for the dual signal on a single metal layer. Accordingly, a single layer wiring method would be desirable in avoiding problems for distributing a pair of signals.

SUMMARY OF THE INVENTION

In preferred embodiments of the present invention, a single metal layer in an integrated circuit supplies a high-speed differential signal from a differential signal source to a plurality of customer. In order to minimize signal interference and skew, signal lines preferably do not intersect except at the signal source, thus enabling usage of a single metal layer for the signal distribution. Preferably, the signal source is positioned centrally with respect to the plurality of customers. Most preferably, the lines used to connect the signal source and the plurality of customers are symmetrical and have substantially equal lengths. In an area where the signal source is situated, line intersections and vias to other metal layers are allowed. In contrast, in the remainder of the integrated circuit a single metal layer is used. In some preferred embodiments of the present invention, up to eight customers can be supplied using a single metal layer.

In some preferred embodiments of the present invention, wiring from the signal source to each customer is by a pair of substantially straight lines to each customer. Most preferably, the pairs of straight lines are radial and are separated by 45° angles for the case of eight customers. In general, lines are preferably separated by $$\frac{360°}{n}$$

angles, where n is the number of customers.

In other preferred embodiments of the present invention, preferably where technology producing the wiring does not allow angles other than right angles, wiring from the signal source to each customer comprises separate lines having right angle turns and right angle branches, so that one line supplies more than one customer.

In some preferred embodiments of the present invention the differential signal is amplified by a buffer. The buffered signal is transmitted to each customer along a pair of wires that are separated by one or more shields to minimize interference effects.

There is provided, according to a preferred embodiment of the present invention, an integrated circuit device, including:

a substrate;

a signal source disposed on the substrate, and which is adapted to supply a pair of signals;

a first plurality of customers positioned remote from the signal source on the substrate, each of which customers is adapted to receive the pair of signals; and a second plurality of conductors, formed substantially within a single layer of conductive material deposited on the substrate, and arranged to distribute the pair of signals from the signal source to each of the customers.

Preferably, the second plurality of conductors are formed so as to minimize differences among the signals received by the customers, Further preferably, the second plurality of conductors include conductors which are substantially equal in length.

Preferably, the second plurality of conductors form a pattern which has a symmetry with respect to the signal source.

Preferably, the signal source is centrally disposed relative to the first plurality of customers.

Preferably, the pair of signals includes a differential pair of clock signals.

Further preferably, the second plurality of conductors includes conductors which make angles of 90° with each other.

Alternatively or additionally, the second plurality of conductors includes conductors which make angles of 45° with each other.

Preferably, the second plurality of conductors includes conductors which are formed as substantially one straight line from the signal source to each respective customer comprised in the first plurality of customers.

Alternatively, the second plurality of conductors includes conductors which are formed as branched lines from the signal source to each respective customer comprised in the first plurality of customers.

There is further provide, according to a preferred embodiment of the present invention, a method for distributing signals within an integrated circuit, including:

providing a substrate;

supplying a pair of signals from a signal source disposed on the substrate;

positioning a first plurality of customers remote from the signal source on the substrate, each of which customers is adapted to receive the pair of signals;

forming a second plurality of conductors substantially within a single layer of conductive material deposited on the substrate, and distributing the pair of signals from the signal source to each of the plurality of customers via the second plurality of conductors.

Preferably, forming the second plurality of conductors includes forming the conductors so as to minimize differences among the signals received by the customers.

Further preferably, forming the second plurality of conductors includes forming the conductors to be substantially equal in length.

Preferably, forming the second plurality of conductors includes forming the conductors in a pattern which has a symmetry with respect to the signal source.

Preferably, the signal source is centrally disposed relative to the first plurality of customers.

Further preferably, the pair of signals includes a differential pair of clock signals.

Preferably, forming the second plurality of conductors includes forming conductors which make angles of 90° with each other.

Alternatively or additionally, forming the second plurality of conductors includes forming conductors which make angles of 45° with each other.

Preferably, forming the second plurality of conductors includes forming conductors which are substantially one straight line from the signal source to each respective customer comprised in the first plurality of customers.

Alternatively, forming the second plurality of conductors includes forming conductors which are branched lines from the signal source to each respective customer comprised in the first plurality of customers.

There is further provided, according to a preferred embodiment of the present invention, a method for fabricating an integrated circuit on a substrate, including:

disposing a signal source, adapted to supply a pair of signals, on the substrate;

distributing a first plurality of customers remote from the signal source on the substrate, each of which customers is adapted to receive the pair of signals; and depositing a single layer of conductive material on the substrate so as to define a second plurality of conductors substantially within the single layer, which conductors are arranged to distribute the pair of signals from the signal source to each of the customers.

Preferably, depositing the single layer of conductive material includes arranging the conductors so as to minimize differences among the signals received by the customers.

Further preferably, depositing the single layer of conductive material includes forming the conductors to be substantially equal in length.

The present invention will be more fully understood from the following detailed description of the preferred embodiment thereof, taken together with the drawings, in which:

DETAILED DESCRIPTION OF PREFERRED EMBODIMENTS

Figure 1:
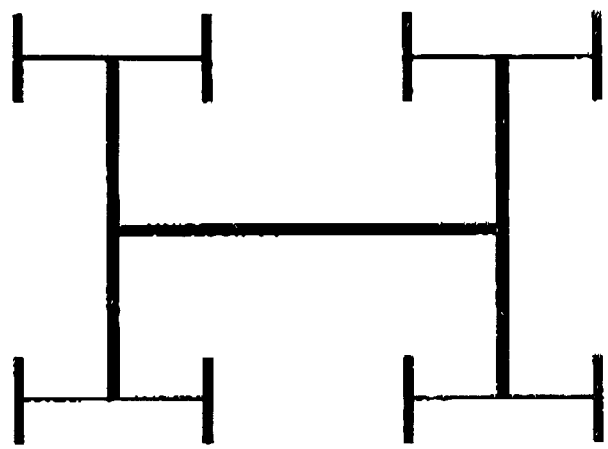
FIG. 1 is a schematic diagram of a symmetric H-tree design used for distributing a single clock signal in an integrated circuit, as is known in the art.
Figure 2:
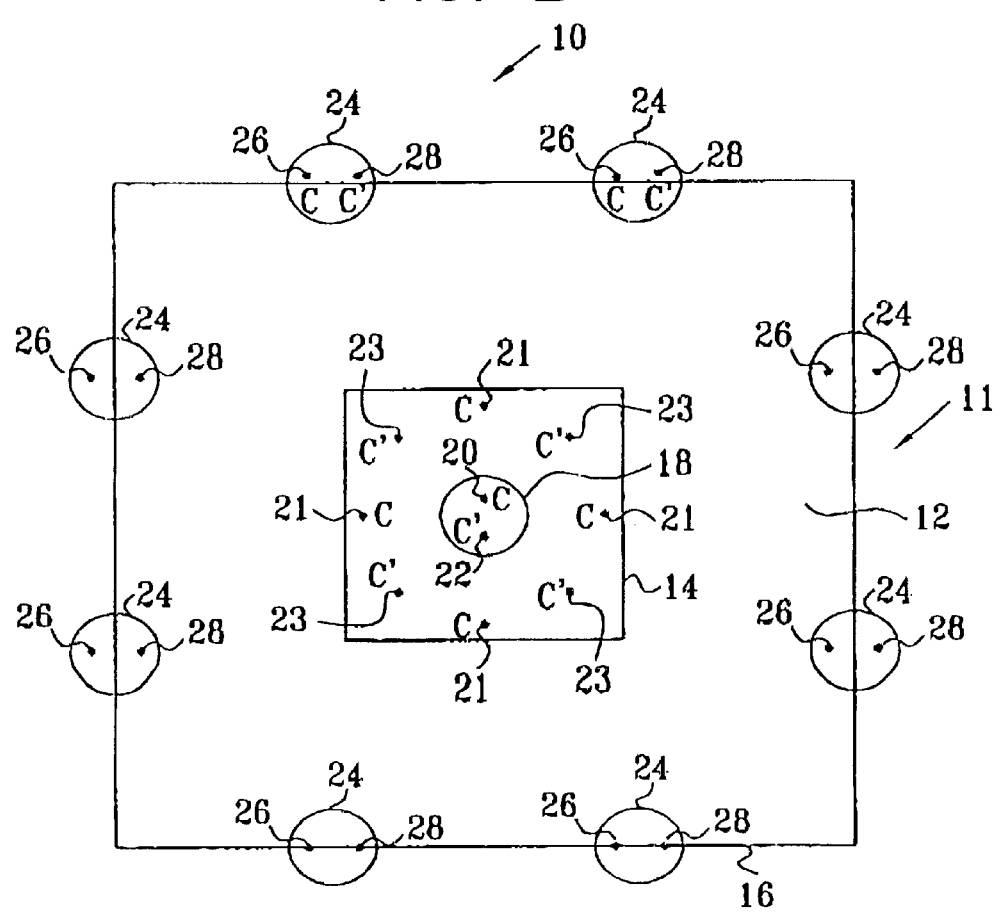
FIG. 2 is a schematic diagram illustrating a layout of an integrated circuit, in accordance with a preferred embodiment of the present invention.

FIG. 2 is a schematic diagram illustrating a layout of an integrated circuit 10, in accordance with a preferred embodiment of the present invention. The circuit comprises a plulrality, preferably eight, of substantially similar customers 24, to be supplied using a single metal layer 12 formed on a substrate 11. A differential clock signal source 18 supplies the plurality of customers, which are positioned on substrate 11 at locations remote from the source. For example, an application comprising a data serializer or deserializer has a plurality of master-slave flip-flops as customers.

The surface of single metal layer 12 is schematically represented as an area between two concentric squares, an inner square 14 and an outer square 16 connecting customers 24. The interior of square 14 defines a multi-layer area in which vias and line intersections are allowed. Square 14 comprises clock source 18 which is the source of a first differential clock signal C 20 and a second differential clock signal C' 22. Since vias and line intersections are allowed within square 14, one or more first differential clock signal C source points 21 and one or more second differential clock signal. C' source points 23 can be formed within the square.

Each customer 24 comprises a terminal clock signal point C 26 and a terminal clock signal point C' 28, and the terminal points are to be supplied from inner square 14. In order to keep skew between signals for a specific customer 24 to a minimum, connection lines for clock signal C and clock signal C' for the customer should be substantially equal in length. The connection lines act as conductors of the clock signals. To keep skew between different customers 24 to a minimum, connection lines to the different customers should also be substantially equal in length. Furthermore, wiring constraints for integrated circuits, as at present known in the art, require that angles between connection lines are 45° or 90°.

Figure 3:
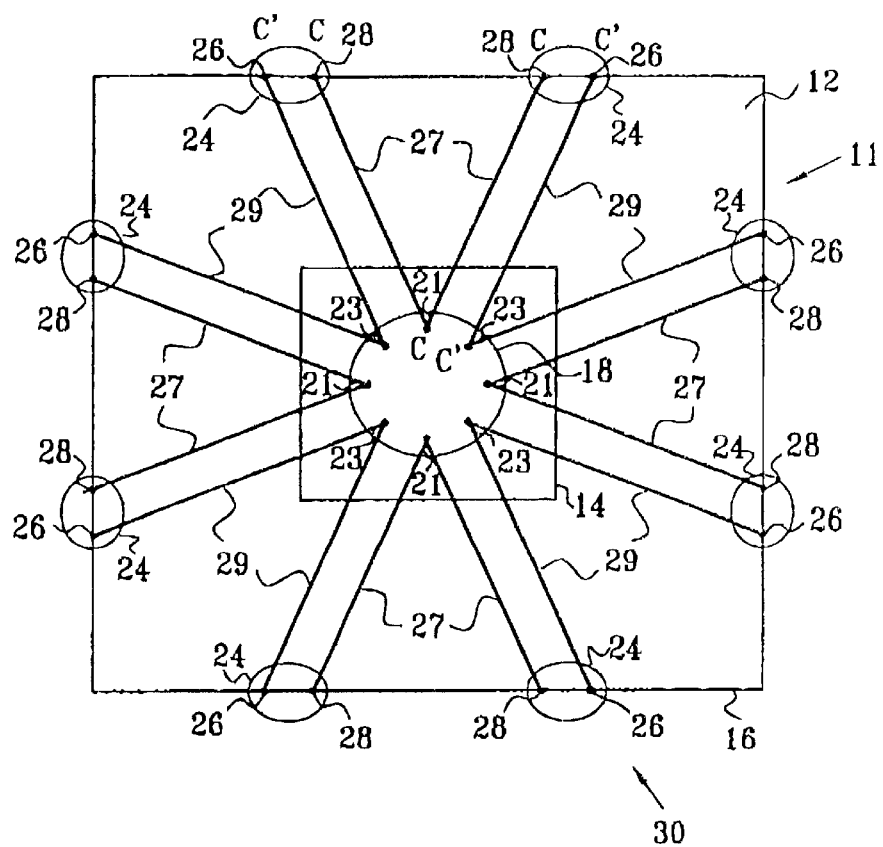
FIG. 3 is a schematic diagram of a wiring layout for the integrated circuit of FIG. 2, in accordance with a preferred embodiment of the present invention.

FIG. 3 is a schematic diagram of a wiring layout 30 for the integrated circuit of FIG. 2, in accordance with a preferred embodiment of the present invention. Square 14 comprises four clock signal C source points 21, and four clock signal C' source points 23, acting as central clock source 18. Each customer 24 is distributed on square 16 so that adjacent customers subtend an angle substantially equal to 45° at source 18. Each source point 21 is connected to two terminal points 28 of adjacent customers 24 by two straight connection lines 27, to deliver clock signal C. Similarly, each source point 23 is connected to two terminal points 26 of adjacent customers 24 by two straight connection lines 29, to deliver clock signal C'. Connection lines 27 and 29 are formed by addition and/or removal of metal from layer 12, by methods known in the art. It will be observed that for each customer 24, connection lines 29 and connection line 27 are substantially equal in length. Connection lines delivering signals C and C' to different customers 24 are substantially equal in length, and are also symmetric. Furthermore, there are no intersections of connection lines in region 12 and the lines intersect at 45° angles.

Figure 4:
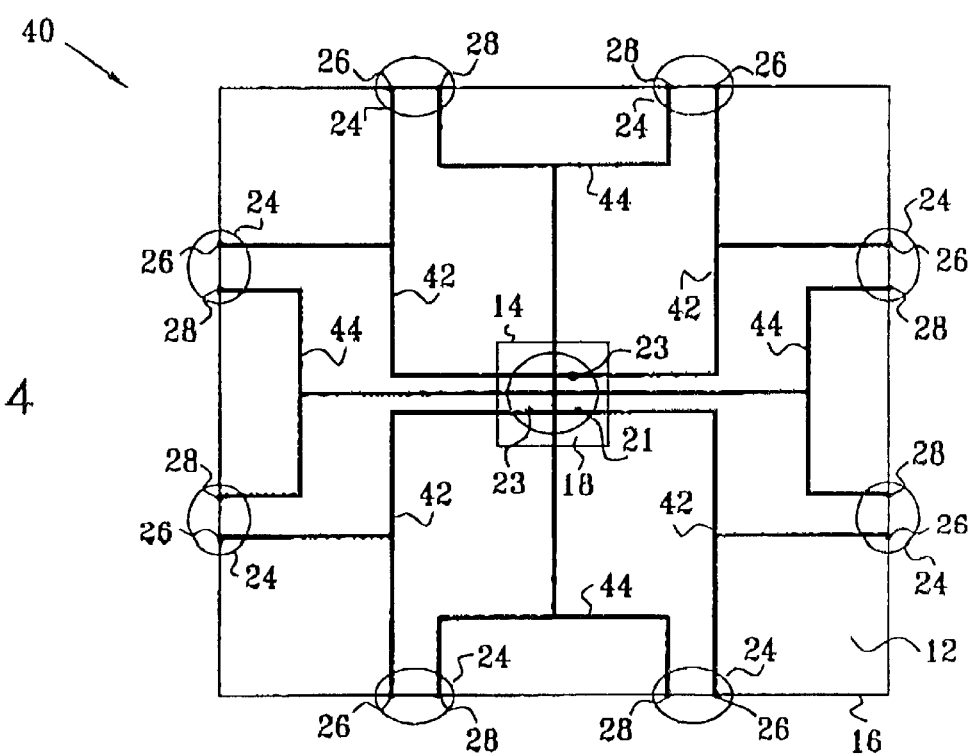
Fig 4 is a schematic diagram of an alternative wiring scheme for the integrated circuit of FIG. 2, in accordance with a preferred embodiment of the present invention.

FIG. 4 is a schematic diagram of an alternative wiring scheme 40 for the integrated circuit of FIG. 2, in accordance with a preferred embodiment of the present invention. Each customer 24 is distributed on square 16 so that the distances from each customer to source 18, measured in a rectilinear manner, are substantially equal. Preferably, adjacent customers 24 subtend 45° at source 18. Square 14 comprises one clock signal C source point 21, and two clock signal C' source points 23. Source point 21 is connected by four branched lines 44 to eight terminal points 28 of customers 24, to deliver clock signal C. Each source point 23 is connected by two branched lines 42 to four terminal points 26 of customers 24, to deliver clock signal C'. It will be observed that for each customer 24, regardless of the angle subtended by adjacent customers at source 18, the connection line delivering signal C and the connection line delivering signal C' are substantially equal in length. Connection lines from different customers 24 to central source 18 are also substantially equal in length. Furthermore, there are no intersections of connection lines in region 12 and all angles between lines are 90°.

Figure 5:
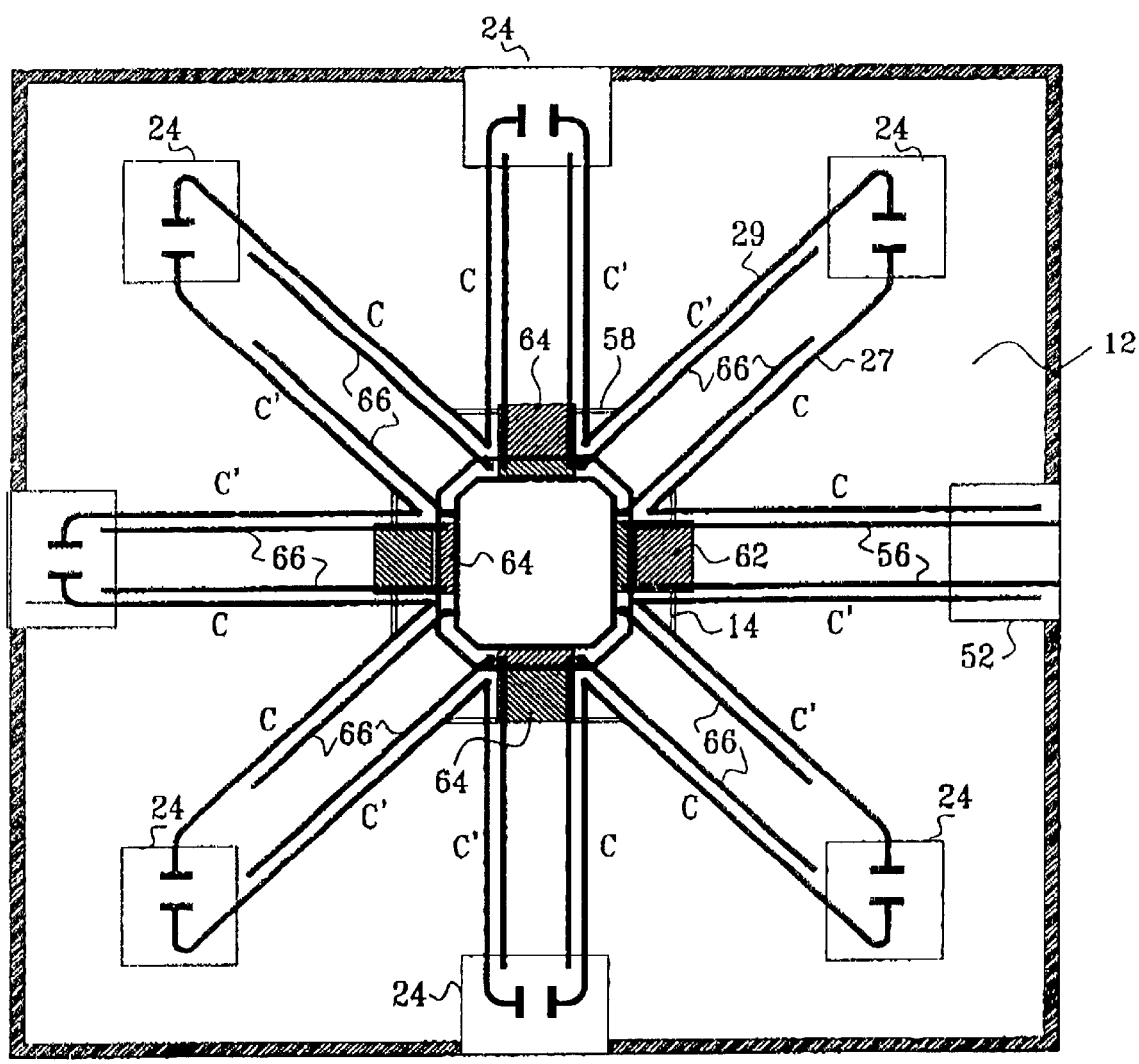
FIG. 5 is a schematic diagram of another integrated circuit layout, in accordance with a preferred embodiment of the present invention.

FIG. 5 is a schematic diagram of another integrated circuit layout 50, in accordance with a preferred embodiment of the present invention. Apart from the differences described below, the operation of layout 50 is generally similar to that of wiring layout 30 (FIG. 3), so that elements indicated by the same reference numerals in layout 50 and layout 30 are generally identical in construction and in operation. Seven customers 24 are positioned on single layer metal surface 12, and a clock driver 52 is also positioned on layer 12, so that the driver and customers 24 are substantially symmetrically arranged about central square 14. Clock driver 52 supplies power to source 18 on lines 56. Clock driver 52 also supplies differential signals C and C', on respective straight connection lines 27 and 29, formed from layer 12, to central clock source 18. The signals are most preferably supplied via a buffer 62 which amplifies the signals and isolates driver 52 from source 18.

Clock source 18 supplies differential signals C and C' on respective straight connecting lines 27 and 29, to customers 24. Preferably, signals between source 18 and each customer 24 are further buffered by respective buffers 64. Between each buffer 64 and customers 24 there are no intersections and/or vias. For each customer 24, paired wires 27 arid 29 which respectively transmit differential clock signals C and C' are separated by a pair of shields 66 to minimize signal interference effects.

It will be appreciated that preferred embodiments of the present invention can supply pluralities of customers, using a single layer, other than those exemplified above. For example, layout 30 (FIG. 3) can be adapted to provide signals to fewer than eight customers 24, not necessarily symmetrically disposed about source 18. It will also be appreciated that by the use of branching and/or designs other than those described hereinabove, more than eight customers can be provided from a central source. It will further be appreciated that pairs of signals, other than differential clock signals, can be supplied to customers of a central signal source by preferred embodiments at the present invention.

It will be understood that while limitations known in the present art set angles between wires for integrated circuits to 45° and 90°, and multiples thereof, the scope of the present invention is not limited by these angles.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. An integrated circuit device, comprising:
   a substrate;
   a signal source disposed on the substrate, and which is adapted to supply a pair of signals;
   a first plurality of customers positioned remote from the signal source on the substrate; and
   a second plurality of conductors, formed substantially within a single layer of conductive material deposited on the substrate, and connected between the signal source and the first plurality of customers so as to distribute the pair of signals from the signal source to each of the customers.

2. A device according to claim 1, wherein the second plurality of conductors comprises multiple pairs of the conductors, each such pair coupled to one of the customers, both the conductors in each such pair being substantially equal in length.

3. A device according to claim 1, wherein the second plurality of conductors comprise conductors which are substantially equal in length.

4. A device according to claim 1, wherein the signal source defines a center of symmetry of the device, and wherein the second plurality of conductors form a pattern which has a rotational symmetry about the center of symmetry.

5. A device according to claim 1, wherein the signal source is centrally disposed relative to the first plurality of customers.

6. A device according to claim 1, wherein the signal source comprises a differential clock signal source, and wherein the pair of signals comprises a differential pair of clock signals generated by the differential clock signal source.

7. A device according to claim 1, wherein the second plurality of conductors comprise conductors which make angles of 90° with each other.

8. A device according to claim 1, wherein the second plurality of conductors comprise conductors which make angles of 45° with each other.

9. A device according to claim 1, wherein the second plurality of conductors comprises conductors which are formed as substantially one straight line from the signal source too each respective customer comprised in the first plurality of customers.

10. A device according to claim 1, wherein the second plurality of conductors comprises conductors which are formed as branched lines from the signal source to each respective customer comprised in the first plurality of customers.

11. A method for distributing signals within an integrated circuit, comprising:
   providing a substrate;
   supplying a pair of signals from a signal source disposed on the substrate;
   positioning a first plurality of customers remote from the signal source on the substrate;
   forming a second plurality of conductors substantially within a single layer of conductive material deposited on the substrate, and
   connecting the first plurality of customers and the signal source with the second plurality of conductors so as to distribute the pair of signals from the signal source to each of the plurality of customers.

12. A method according to claim 11, wherein forming the second plurality of conductors comprises forming the conductors so as to minimize differences among the signals received by the customers.

13. A method according to claim 11, wherein forming the second plurality of conductors comprises forming the conductors to be substantially equal in length.

14. A method according to claim 11, wherein forming the second plurality of conductors comprises forming the conductors in a pattern which has a symmetry with respect to the signal source.

15. A method according to claim 11, wherein the signal source is centrally disposed relative to the first plurality of customers.

16. A method according to claim 11, wherein the pair of signals comprises a differential pair of clock signals.

17. A method according to claim 11, wherein forming the second plurality of conductors comprises forming conductors which make angles of 90° with each other.

18. A method according to claim 11, wherein forming the second plurality of conductors comprises forming conductors which make angles of 45° with each other.

19. A method according to claim 11, wherein forming the second plurality of conductors comprises forming conductors which are substantially one straight line from the signal source to each respective customer comprised in the first plurality of customers.

20. A method according to claim 11 wherein forming the second plurality of conductors comprises forming conductors which are branched lines from the signal source to each respective customer comprised in the first plurality of customers.

21. A method for fabricating an integrated circuit on a substrate, comprising:

disposing a signal source, adapted to supply a pair of signals, on the substrate;

distributing a first plurality of customers at respective pre-determined positions remote from the signal source on the substrate; and depositing a single layer of conductive material on the substrate so as to define a second plurality of conductors substantially within the single layer, which conductors connect the signal source and the first plurality of customers so as to distribute the pair of signals from the signal source to each of the customers.

22. A method according to claim 21, wherein depositing the single layer of conductive material comprises arranging the conductors so as to minimize differences among the signals received by the customers.

23. A method according to claim 21, wherein depositing the single layer of conductive material comprises forming the conductors to be substantially equal in length.

* * * * *